United States Patent
Matsumoto

(10) Patent No.: US 6,198,940 B1
(45) Date of Patent: Mar. 6, 2001

(54) MOBILE RADIOPHONE APPARATUS

(75) Inventor: Kouichi Matsumoto, Saitama (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/105,467

(22) Filed: Jun. 26, 1998

(30) Foreign Application Priority Data

Jun. 26, 1997 (JP) .................................................. 9-170281

(51) Int. Cl.⁷ .................................................. H04Q 7/20
(52) U.S. Cl. .......................... 455/550; 455/67.3; 455/575
(58) Field of Search .................................. 455/550, 67.1, 455/67.3, 115, 95, 575

(56) References Cited

U.S. PATENT DOCUMENTS

| | | |
|---|---|---|
| 3,789,392 | 1/1974 | Candiani . |
| 4,852,090 * | 7/1989 | Borth .................................... 370/104 |
| 5,005,150 | 4/1991 | Dent et al. . |
| 5,066,952 | 11/1991 | Koerner . |
| 5,353,374 * | 10/1994 | Wilson et al. ....................... 395/2.35 |
| 5,790,941 * | 8/1998 | Peponides ............................... 455/87 |

FOREIGN PATENT DOCUMENTS

| | | |
|---|---|---|
| 54-33013 | 3/1979 | (JP) . |
| 60-54538 | 3/1985 | (JP) . |
| 1-248711 | 10/1989 | (JP) . |

* cited by examiner

Primary Examiner—Daniel S. Hunter
Assistant Examiner—Thuan T. Nguyen
(74) Attorney, Agent, or Firm—Young & Thompson

(57) ABSTRACT

A mobile radiophone apparatus includes an A/D converter for outputting an input analogue voice signal as quantized data and a highly efficient voice encoder for extracting features of the quantized data output from the A/D converter and converting the data to codes of a smaller quantity by a fixed time unit. The number of quantization bits in the A/D converter is established to be larger than the number of quantization bits possible to be input to the highly efficient voice encoder. A bit-number converter is provided for converting the number of bits of the quantized data output at the A/D converter to the number of quantization bits possible to be input to the highly efficient voice encoder corresponding to a maximum amplitude value within the fixed time unit. the conversion parameter for the quantized data in the bit-number converter is transmitted in addition to the codes output at the highly efficient voice encoder.

5 Claims, 3 Drawing Sheets

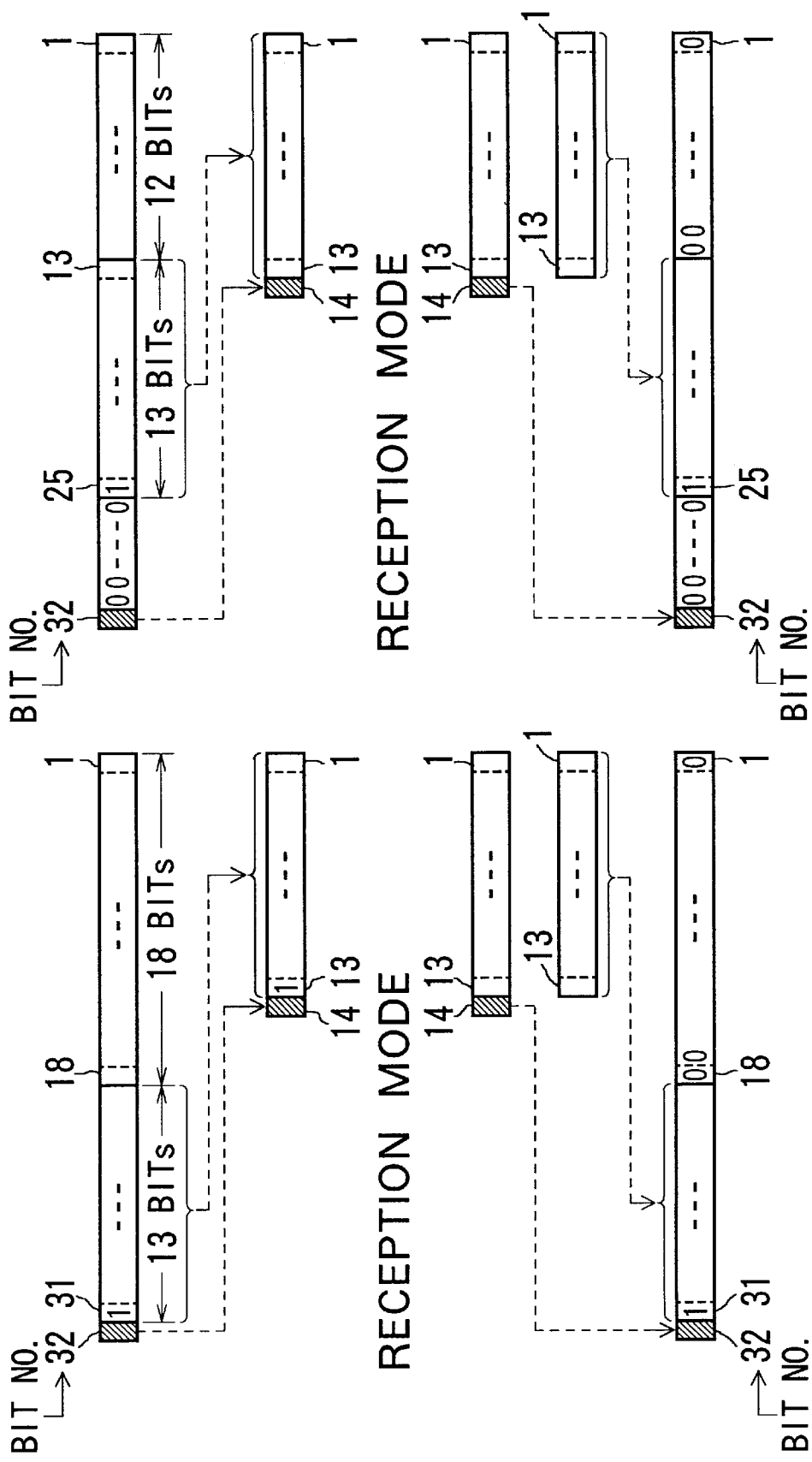

MOBILE RADIOPHONE APPARATUS

BACKGROUND OF THE INVENTION

1. Field of the Invention

The present invention relates to a mobile radiophone apparatus, and more particularly to a digital mobile radiophone apparatus including a highly efficient voice encoder in which an input analogue voice signal is quantized through an A/D conversion and features of the quantized voice signal are extracted to convert the signal to codes of a smaller data quantity.

2. Description of the Related Art

In a highly efficient voice-encoding technique for voice signals in a digital mobile radiophone apparatus, after an input signal such as a voice is quantized through an A/D conversion, the quantized signal is divided into fixed units along the time axis and a group of plural quantization samples is encoded together. For encoding, there are methods such as linear estimation analysis in which calculation is performed by using a parameter representing a feature in time of the voice signal as a coefficient for filtering (refer to "DIGITAL MOBILE RADIOPHONE SYSTEM STANDARD RCR-STD-27B", p.515, issued by, a foundation, Denpa System Kaihatu Center, for instance).

By the way, the analogue voice signal input to the mobile radiophone apparatus is quantized through the A/D conversion and then input to the highly efficient voice encoder. But the amplitude data quantized through the A/D conversion are input to the highly efficient voice encoder as they are, in general.

FIG. 1 is a block diagram showing a conventional mobile radiophone apparatus 2 in a digital communication system, in respect of conversion an analogue voice signal input as a voltage amplitude to highly efficient voice codes and conversion of highly efficient voice codes to an analogue voice signal.

As shown in FIG. 1, an analogue voice input to a microphone 25 of the digital mobile radiophone apparatus 2 is input to an A/D converter 21 as a voltage amplitude, converted to quantized data representing the voltage amplitude in the A/D converter 21, and then input to a highly efficient voice encoder 22. The highly efficient voice encoder 22 extracts their features in time from the quantized data representing the voltage amplitude, performs highly efficient voice-encoding, and then sends out the encoded codes to a transmitter 28 as transmission voice codes. The transmission voice codes are modulated in the transmitter 28 and then transmitted through an antenna 29 to a base station.

On the other hand, modulated highly efficient voice codes received from the base station through the antenna 29 of the digital mobile radiophone apparatus 2 are demodulated in a receiver 27 and then input to a highly efficient voice decoder 23. The highly efficient voice decoder 23 decodes the codes to quantized data representing a voltage amplitude and then sends out them to a D/A converter 24. The data are converted to the voltage amplitude in the D/A converter 24 and then output through a speaker 26 as an analogue voice.

As described above, in the conventional highly efficient voice-encoding method in the mobile radiophone apparatus, because the quantized data A/D-converted are input to the highly efficient voice encoder as they are, the amplitude of the voice signal is small. In the case of a little variation of the quantization samples, there is such problem that faithfulness to the original input voice signal decreases upon decoding the voice-encoded data. This is because calculation error upon performing highly efficient voice-encoding is large owing to a small quantity of information included by the input voice signal or the like in the case of a little variation of the samples.

SUMMARY OF THE INVENTION

It is an object of the present invention to provide a mobile radiophone apparatus in which a voice can be decoded more faithfully to the original voice upon decoding with a calculation error upon performing highly efficient voice-encoding even in case of a small amplitude of an input voice signal in a digital mobile radiophone apparatus.

For attaining the above object, according to the present invention, a mobile radiophone apparatus including an A/D converter for outputting an input analogue voice signal as quantized data and a highly efficient voice encoder for extracting features of the quantized data output at said A/D converter and converting the data to codes of a smaller data quantity by a fixed time unit to output the codes, is characterized by comprising a transmitting system in which the number of quantization bits in said A/D converter is established to be larger than the number of quantization bits possible to be input to said highly efficient voice encoder and a converter is provided for converting the number of bits of the quantized data output at said A/D converter to the number of quantization bits possible to be input to said highly efficient voice encoder as an amplitude value as large as possible by the fixed time unit to output the converted data to said highly efficient voice encoder and the conversion parameter for the quantized data in said converter is transmitted in addition to the codes output at said highly efficient voice encoder, and a receiving system in which codes output at said highly efficient voice encoder are received and then decoded to quantized data in a highly efficient voice decoder and then said quantized data are converted to the number of quantization bits output at said A/D converter on the basis of said conversion parameter and then converted to an analogue signal in a D/A converter to be output as a voice.

As described above, because the conversion method of the number of quantization bits is changed by unit time in accordance with the amplitude of the quantized data and the quantized data are input to the highly efficient voice encoder by unit time as large values as possible, the calculation error can be reduced upon highly efficient voice-encoding.

Besides, in the above construction of the mobile radiophone apparatus, if the above conversion parameter employs the shift quantity of the number of bits obtained by the manner that the quantized data output at the above A/D converter are referred by unit time and the number of the effective figures of quantization bits possible to be input to the above highly efficient voice encoder is subtracted from the maximum number of bits in the unit time, the calculation with the conversion parameter becomes relatively easy and it becomes possible easily to carry out the present invention because the conversion can easily be performed since it is merely bit-shifting based on the shift quantity.

BRIEF DESCRIPTION OF THE DRAWINGS

FIGS. 3A and 3B illustrate how to convert the number of bits of quantized data by a converter.

DETAILED DESCRIPTION OF THE PREFERRED EMBODIMENT

The present invention will now be described with reference to drawings.

Figure 1:
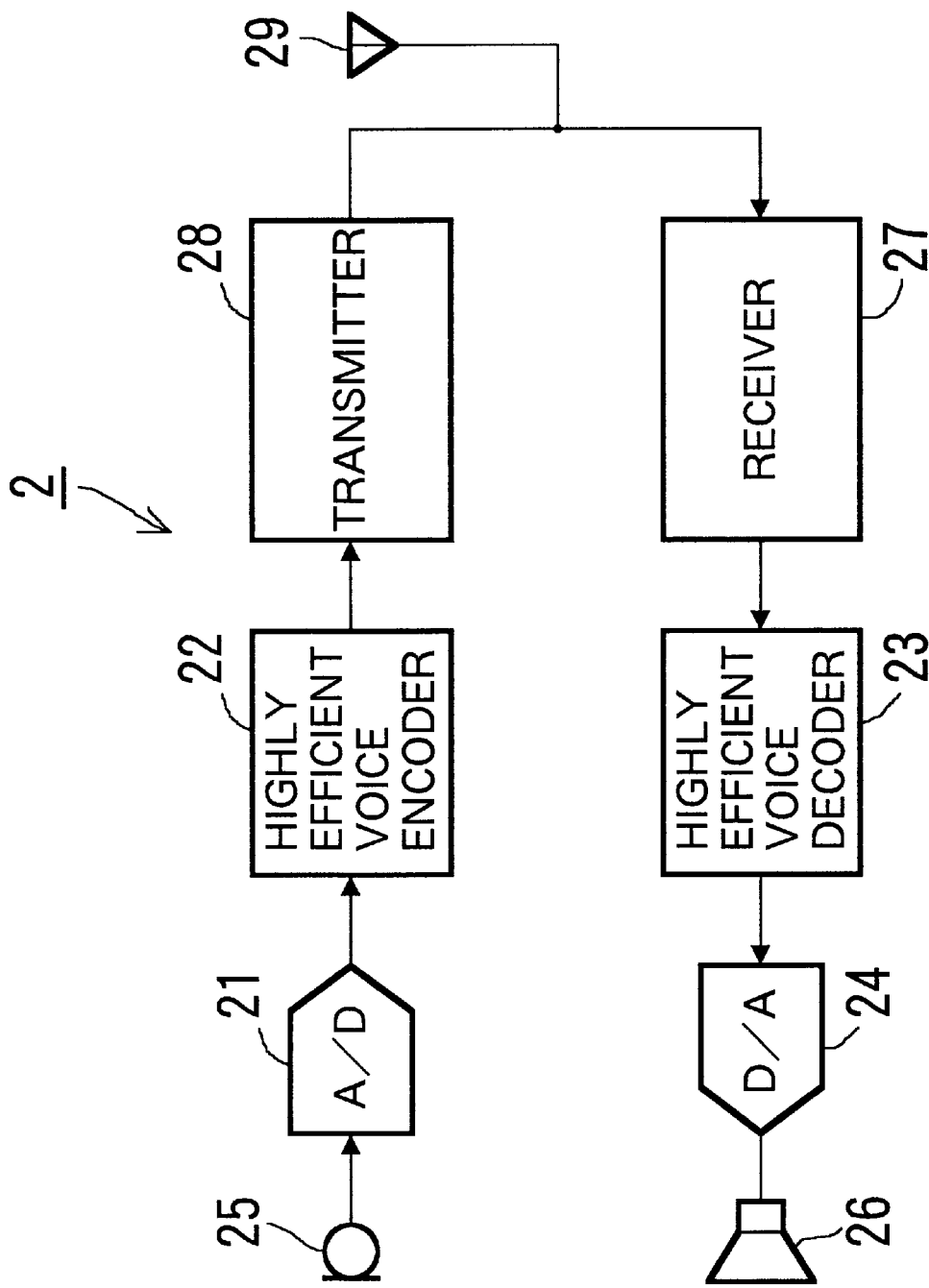
FIG. 1 is a block diagram showing the construction of a conventional mobile radiophone apparatus in a digital communication system.
Figure 2:
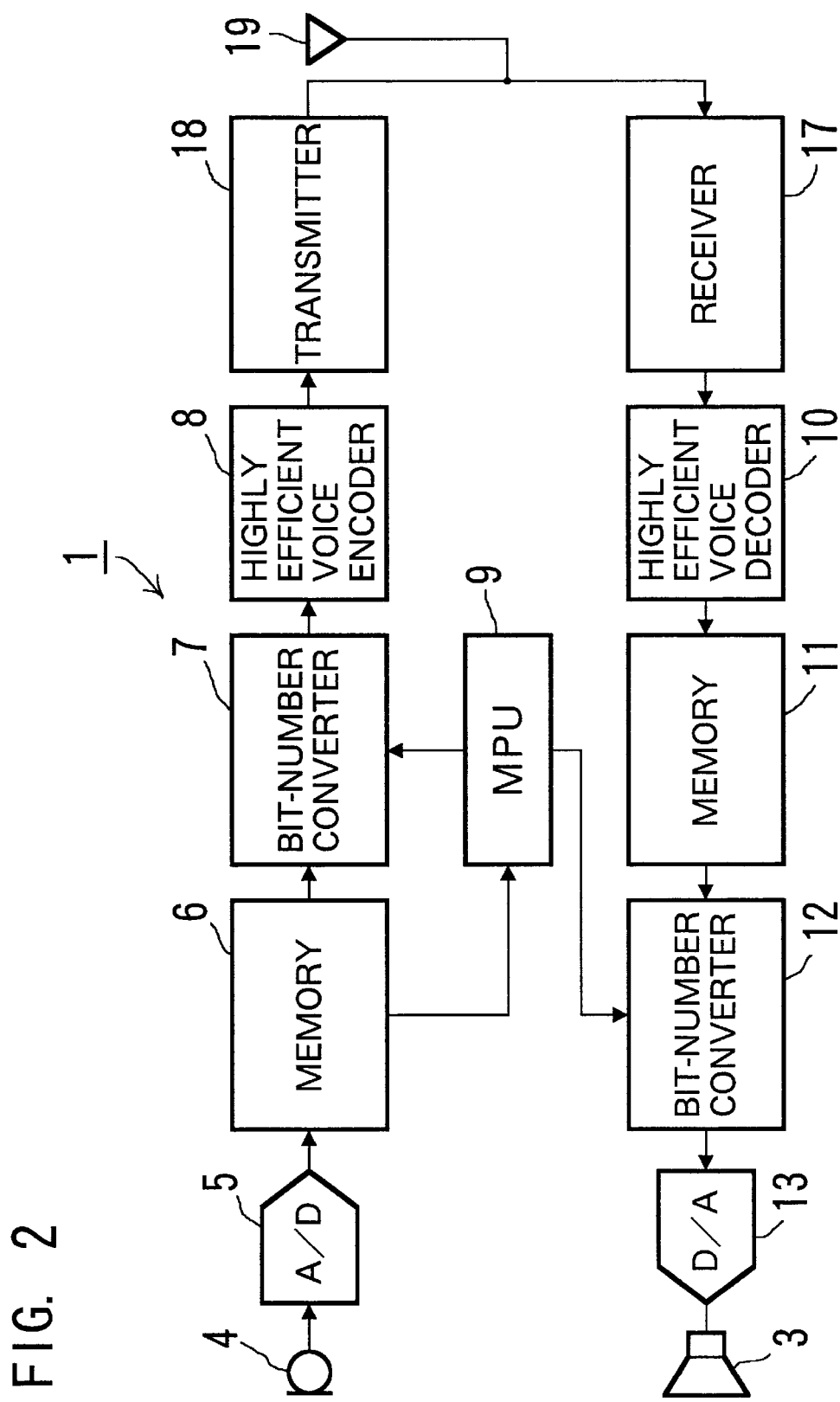
FIG. 2 is a block diagram showing the construction of a mobile radiophone apparatus in a digital communication system according to an embodiment of the present invention.

FIG. 2 is a block diagram showing the construction of a digital mobile radiophone apparatus 1 according to an embodiment of the present invention.

A transmitting system of the mobile radiophone apparatus 1 includes a microphone 4 for inputting a voice and converting it to an analogue voice signal, an A/D converter 5 for quantizing the analogue voice signal output at the microphone 4, a highly efficient voice encoder 8 for dividing the quantized voice signal into fixed units along the time axis and encoding a group of plural quantization samples together, and a transmitter 18 for modulating voice codes output at the highly efficient voice encoder 8 to transmit them through an antenna 19 to a base station. Here is the characteristic that the number of quantization bits of the A/D converter 5 is established to be larger than the number of quantization bits possible to be input to the highly efficient voice encoder 8.

Between the A/D converter 5 and the highly efficient voice encoder 8, there are provided a memory 6 for storing an output signal of the A/D converter 5 as quantization samples by fixed unit time and a bit-number converter 7 for converting the quantization samples stored in the memory 6 to the number of quantization bits according to the number of quantization bits of the highly efficient voice encoder 8, and further provided a microprocessor (MPU) 9 for selecting a conversion method of the number of bits on the basis of the amplitude of the quantization samples stored in the memory 6 and indicating the conversion method to the bit-number converter 7.

In this embodiment, the highly efficient voice encoder 8 encodes the group of quantization samples for every 20 msec together. The memory 6 stores the output signal of the A/D converter 5 for every 20 msec. By way of example, the number of quantization bits of the A/D converter 5 is selected to be 32 bits and the number of quantization bits of the highly efficient voice encoder 8 is selected to be 14 bits.

On the other hand, a receiving system of the mobile radiophone apparatus 1 includes a receiver 17 for demodulating a signal received from the base station through the antenna 19, a highly efficient voice decoder 10 for decoding the signal demodulated in the receiver 17 to quantization samples by fixed unit time, a D/A converter 13 for converting the quantized voice signal to an analogue voice signal, and a speaker 3 for outputting the analogue voice signal as a voice. Besides, between the highly efficient voice decoder 10 and the D/A converter 13, there are provided a memory 11 for temporarily storing an output of the highly efficient voice decoder 10 and a bit-number converter 12 for converting quantization samples stored in the memory 11 to the original amplitude data input in the transmitting system. The operation of the converter 12 is controlled by the microprocessor 9 with a conversion parameter included by the received signal.

In this embodiment, the highly efficient voice decoder 10 decodes highly efficient voice codes received from the base station and demodulated to quantized data in which the number of bits is 14 bits. The number of input quantization bits of the D/A converter 13 is 32 bits.

Next, the operation of the mobile radiophone apparatus 1 according to this embodiment will be described with reference to FIG. 2.

At first, the operation of the transmitting system will be described. The A/D converter 5 quantizes a transmission voice input to the microphone 4 by 32 bits. The voice signal quantized by 32 bits in the A/D converter 5 and converted to a digital signal representing the amplitude with values of "1" and "0" is stored in the memory 6 by the unit of 20 msec. The microprocessor 9 refers every time the quantized data by the unit of 20 msec stored in the memory 6 and finds the maximum of the quantized data by the time unit. On the basis of the found maximum, the microprocessor 9 informs the bit-number converter 7 of the conversion method for converting the quantized data from 32 bits to 14 bits.

On the basis of the data received from the to microprocessor 9, the bit-number converter 7 converts the number of bits from 32 bits to 14 bits so that the maximum of the data stored in the memory 6 coincides with the maximum of the output of the bit-number converter 7. Hereinafter, this converting operation is called "trimming". Its concrete examples will be described later.

The highly efficient voice encoder 8 converts the quantized data of 14 bits output at the bit-number converter 7 to highly efficient voice codes by the unit of 20 msec and then sends out them to the transmitter 18. In this case, trimming information at what level trimming is performed to the quantized data of 32 bits upon trimming in the bit-number converter 7 is also sent to the highly efficient voice encoder 8 and added to the voice codes as a conversion parameter to be sent out to the transmitter 18. The transmitter 18 modulates the voice codes and then transmits them through the antenna 19 to the base station.

Next, the operation of the receiving system will be described. Properly speaking, here should be described the case that a transmission signal transmitted by the above operation of the transmitting system is received by another mobile radiophone apparatus through the base station. For the sake of convenience, however, the description will be made by using the construction of the receiving system of the mobile radiophone apparatus 1 shown in FIG. 2.

An analogue transmission signal transmitted from another mobile radiophone apparatus and received through the base station and the antenna 19 is converted to a digital base band signal (highly efficient voice codes) in the receiver 17 and then sent out to the highly efficient voice decoder 10. The highly efficient voice decoder 10 decodes the highly efficient voice codes to quantized data in which the number of quantization bits is 14 bits. At this time, information of trimming, that is, the conversion parameter added to the voice codes is sent out to the bit-number converter 12. The memory 11 stores the quantized data (14 bits), which are output at the highly efficient voice decoder 7, by the unit of 20 msec and then sends out them to the bit-number converter 12. The quantized data which the bit-number converter 12 receives from the memory 11 differs in amplitude from the original input voice due to the pretreatment of voice-encoding in transmitting, that is, the converting process (that is, trimming) by the bit-number converter 7. Therefore, as instructed by the microprocessor 9, based on the trimming information, that is, the conversion parameter received, the bit-number converter 12 converts the digital voice data to quantized data of 32 bits which is the number of bits upon being output at the A/D converter 5 in the transmitting system. The quantized data converted to 32 bits as described above is then converted to an analogue voice signal in the D/A converter 13 and then output through the speaker 3 as a voice.

Here, concrete examples of the trimming process by the bit-number converter 7 in the transmitting system and the inversely converting process by the bit-number converter 12 in the receiving system will be described in detail with reference to FIGS. 3A and 3B.

In this embodiment, the reason why the voice signal input through the microphone 4 is quantized by 32 bits and then converted to 14 bits is that even data in the voice wave form of a little amplitude among the quantized data divided by unit time are made possible to be encoded by obtaining information as much as possible from the data of that part (that is, in order to reflect to minute changes).

Here, for converting the number of quantization bits of the quantized data from 32 bits to 14 bits, the method of simple cutting away of the lower figures is generally employed. Cutting away of the lowermost figure, that is, shifting a number represented by the binary scale to the lower direction by 1 bit is, for instance, $2^2 \rightarrow 2^1$. This means that the number is divided by 2. Accordingly, for shifting a number represented by the binary scale to the lower direction by x bits, the number is divided by $2^x$ (ignore the remainder).

On the other hand, in case of quantizing a voice signal by 32 bits or 14 bits, the effective figures are 31 bits or 13 bits because 1 bit is required for representing the sign of plus or minus of the signal. In this case, the uppermost bit (the 32nd bit or the 14th bit) of the data represents the sign. Now, in the transmitting system, in the case that the amplitude of a voice signal input through the microphone 4 is large, it is assumed that the uppermost bit having the value of the quantized data which is obtained by quantizing the voice signal by a certain unit time (20 msec) is the 31st bit as shown in FIG. 3A. In this case, the quantized data of 14 bits (1 bit among them is the sign bit) obtained through a trimming process by the bit-number converter 7 correspond to the upper 14 bits including the sign bit and the lower 18 bits (32 bits–14 bits) are cut away. The conversion parameter x in this case will be 18.

But it is assumed that the amplitude of the voice signal input through the microphone 4 is small and the uppermost bit having the value of the quantized data which is obtained by quantizing the voice signal by a certain unit time is the 25th bit as shown in FIG. 3B. In this case, the quantized data (14 bits) obtained through the trimming process by the bit-number converter 7 correspond to the data from the 13th bit to the 25th bit. The lower 12 bits are cut away. The conversion parameter in this case will be 12.

In the receiving system, when the voice signal the amplitude of which is large as shown in FIG. 3A, the bit-number converter 12 shifts the 13 bits except the sign bit of the quantized data of 14 bits (1 bit among them is the sign bit) output at the highly efficient voice decoder 10 to the upper bit direction by 18 bits (multiplies the data by $2^x$) on the basis of the conversion parameter (x=18) and places "0" on the lower bits from the 1st bit to the 17th bit. The sign bit of the 14th bit is added to the 32nd bit as the sign bit. By this manner, the quantized data of 32 bits can be obtained.

But when the voice signal the amplitude of which is small as shown in FIG. 3B, the bit-number converter 12 shifts the 13 bits except the sign bit of the quantized data of 14 bits (1 bit among them is the sign bit) output at the highly efficient voice decoder 10 to the upper bit direction by 12 bits (multiplies the data by $2^x$) on the basis of the conversion parameter (x=12), added the sign bit of the 14th bit to the 32nd bit as the sign bit and places "0" the 31st bit to the 26th bit. By this manner, the quantized data of 32 bits can be obtained.

In this embodiment, although the number of quantization bits for the input analogue voice signal in the transmitting system is 32 bits, the number of quantization bits of highly efficient voice-encoding is 14 bits and the unit time for encoding in the highly efficient voice encoder is 20 msec, those numerical values have been taken by way of examples and the present invention is not limited to those numerical values upon practice. Besides, the method for obtaining the conversion parameter is also not limited to the above-described method if it is the method in which the change of numerical values can be represented as minutely as possible in the case of a small amplitude of the wave form.

According to the present invention, in a digital mobile radiophone apparatus including a highly efficient voice encoder, because the number of quantization bits upon A/D-converting an input voice signal is established to be larger than the number of bits possible to be input to the highly efficient voice encoder and a converter performs a conversion in order to be data having a change width as.large as possible to the number of input bits to the highly efficient voice encoder in accordance with the amplitude of quantized data, the calculation error upon performing highly efficient voice-encoding even in the case that the input original voice is small. Accordingly, the voice can be decoded more faithfully to the original voice upon decoding.

What is claimed is:

1. A mobile radiophone apparatus including an A/D converter for outputting an input analogue voice signal as quantized data and a highly efficient voice encoder for extracting features of the quantized data output at said A/D converter and converting the data to codes of a smaller data quantity by a fixed time unit to output the codes, wherein the number of quantization bits in said A/D converter is established to be larger than the number of quantization bits possible to be input to said highly efficient voice encoder and a bit-number converter is provided for converting the number of bits of the quantized data output at said A/D converter to the number of quantization bits possible to be input to said highly efficient voice encoder corresponding to a maximum amplitude value within the fixed time unit to output the converted data to said highly efficient voice encoder and the conversion parameter for the quantized data in said bit-number converter is transmitted in addition to the codes output at said highly efficient voice encoder.

2. A communication system for mobile radiophone apparatus in which an input analogue voice signal is converted to quantized data through an A/D conversion and highly efficient voice-encoding is performing to said quantized data to be transmitted to a base station, comprising a transmitting system in which the number of quantization bits of the quantized data through said A/D conversion is established to be larger than the number of quantization bits possible to be input to a highly efficient voice encoder and the number of bits of the quantized data through said A/D conversion is converted to the number of quantization bits possible to be input to said highly efficient voice encoder corresponding to a maximum amplitude value within a fixed time unit and the conversion parameter for said quantized data is transmitted to the base station in addition to highly efficient voice codes, and a receiving system in which the highly efficient voice codes with said conversion parameter are received and then decoded to quantized data in a highly efficient voice decoder and then said quantized data are converted to the number of quantization bits converted through said A/D conversion in the transmitting system on the basis of said conversion parameter and then converted to an analogue signal through a [D/A] A/D conversion to be input as a voice.

3. A mobile radiophone apparatus according to claim 1 further comprising a memory for storing the quantized data output at said A/D converter, a microprocessor for selecting the conversion method for performing a conversion to the number of bits possible to be input to the highly efficient voice encoder on the basis of the number of bits of said quantized data and calculating the parameter for the conversion, and a bit-number converter for converting the number of bits of said quantized data on the basis of said conversion method.

4. A mobile radiophone apparatus including an A/D converter for out-putting an input analogue voice signal as quantized data and a highly efficient voice encoder for extracting features of the quantized data output at said A/D converter and converting the data to codes of a smaller data quantity by a fixed time unit to output the codes, wherein the number of quantization bits in said A/D converter is established to be larger than the number of quantization bits possible to be input to said highly efficient voice encoder and a bit-number converter is provided for converting the number of bits of the quantized data output at said A/D converter to the number of quantization bits possible to be input to said highly efficient voice encoder corresponding to a maximum amplitude value within the fixed time unit to output the converted data to said highly efficient voice encoder and the conversion parameter for the quantized data in said bit-number converter is transmitted in addition to the codes output at said highly efficient voice encoder, wherein said conversion parameter represents the shift quantity of the number of bits obtained by referring the quantized data output at said A/D converter by unit time and subtracting the number of the effective figures of the number of quantization bits possible to be input to said highly effective voice encoder from the number of bits of the maximum of the quantized data in unit time.

5. A communication system for mobile radiophone apparatus according to claim 2, wherein said conversion parameter represents the shift quantity of the numerical value obtained by referring the quantized data output at said A/D converter by unit time and subtracting the number of quantization bits possible to be input to said highly effective voice encoder from the number of bits of the maximum of the quantized data in unit time.

* * * * *